(12) United States Patent
Ha et al.

(10) Patent No.: US 11,522,035 B2
(45) Date of Patent: Dec. 6, 2022

(54) DISPLAY PANEL

(71) Applicant: Samsung Display Co., Ltd., Yongin-si (KR)

(72) Inventors: Jaeheung Ha, Suwon-si (KR); Yisu Kim, Seoul (KR); Yongchan Ju, Yongin-si (KR); Suk Hoon Kang, Seoul (KR); Wonjong Kim, Suwon-si (KR); Jongwoo Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 190 days.

(21) Appl. No.: 16/929,830

(22) Filed: Jul. 15, 2020

(65) Prior Publication Data

US 2021/0134924 A1 May 6, 2021

(30) Foreign Application Priority Data

Oct. 31, 2019 (KR) .......................... 10-2019-0137837

(51) Int. Cl.
*H01L 27/32* (2006.01)
*H01L 51/52* (2006.01)

(52) U.S. Cl.
CPC ...... *H01L 27/3276* (2013.01); *H01L 27/3246* (2013.01); *H01L 51/5253* (2013.01); *H01L 2251/303* (2013.01)

(58) Field of Classification Search
CPC ....... H01L 51/5253–5256; H01L 51/56; H01L 27/3276; H01L 27/3246; H01L 2251/303
See application file for complete search history.

(56) References Cited

U.S. PATENT DOCUMENTS

| | | | |
|---|---|---|---|
| 2018/0033830 A1 | 2/2018 | Kim et al. | |
| 2018/0033998 A1 | 2/2018 | Kim et al. | |
| 2018/0097200 A1 | 4/2018 | Park et al. | |
| 2018/0108867 A1 | 4/2018 | Lee et al. | |
| 2018/0151838 A1* | 5/2018 | Park | H01L 27/3258 |
| 2019/0006431 A1* | 1/2019 | Won | G06F 3/0443 |
| 2019/0036063 A1* | 1/2019 | Lee | G06F 3/0412 |
| 2019/0044094 A1* | 2/2019 | Nakayama | B32B 27/365 |
| 2019/0312226 A1* | 10/2019 | Huang | H01L 51/5253 |
| 2020/0099007 A1* | 3/2020 | Zhao | H01L 27/3283 |
| 2021/0104701 A1* | 4/2021 | Guo | H01L 51/5253 |
| 2021/0226162 A1* | 7/2021 | Qian | H01L 51/56 |

FOREIGN PATENT DOCUMENTS

| | | |
|---|---|---|
| KR | 10-2017-0062856 A | 6/2017 |
| KR | 10-2017-0078986 A | 7/2017 |
| KR | 10-2018-0013452 A | 2/2018 |
| KR | 10-2018-0014398 A | 2/2018 |

* cited by examiner

*Primary Examiner* — Shaun M Campbell
(74) *Attorney, Agent, or Firm* — Lewis Roca Rothgerber Christie LLP (57) ABSTRACT

A display panel includes a base layer, a circuit layer, a light emitting element, a pixel defining film, an encapsulation layer, and a first dam. The base layer may include a display area and a non-display area adjacent to the display area. The encapsulation layer may include a first inorganic film, an organic film, and a second inorganic film. The first dam may be disposed between the first inorganic film and the second inorganic film, and outside the organic film. The first dam may overlap the non-display area and the pixel defining film on a plane. Therefore, in the display panel of an embodiment, the non-display area may be reduced.

19 Claims, 7 Drawing Sheets

| | 1D | 2D | 3D |
|---|---|---|---|
| Example 1 |  |  |  |
| Comparative Example 1 |  |  |  |

DISPLAY PANEL

CROSS-REFERENCE TO RELATED APPLICATION

This application claims priority to and the benefit of Korean Patent Application No. 10-2019-0137837, filed on Oct. 31, 2019, the entire content of which is hereby incorporated by reference.

BACKGROUND

1. Field

One or more aspects of embodiments of the present disclosure relate to a display panel, and for example, to a display panel with or including a dam.

2. Description of the Related Art

A display device may be divided into (e.g., include) a display area where an image is displayed, and a non-display area around the display area. Efforts have recently focused on increasing the display area (where an image is displayed) by reducing the size of the non-display area.

An organic light emitting display device includes organic light emitting elements that may include organic materials. In order to protect the organic materials, which may be vulnerable to oxygen and/or moisture, various techniques for sealing the organic light emitting elements are being developed. Among available techniques, an encapsulation technique uses an encapsulation layer deposited on the organic light emitting element to block an infiltration path of air, moisture, etc. The encapsulation layer may include a structure in which an inorganic film including inorganic materials and an organic film including organic materials are alternatingly stacked. However, when the organic material overflows (e.g., escapes the deposition area) during the process of forming an organic film, air and/or moisture may infiltrate into the exposed organic layer.

SUMMARY

One or more aspects of embodiments of the present disclosure are directed toward a display panel in which a non-display area is reduced.

One or more example embodiments of the present disclosure provide a display panel including a base layer, a circuit layer, a light emitting element, a pixel defining film, an encapsulation layer, and a first dam. A display area and a non-display area adjacent to the display area may be defined in the base layer. The circuit layer may be disposed on the base layer. The circuit layer may include a pixel circuit layer overlapping the display area and a driving circuit layer overlapping the non-display area and including a power electrode and a driving signal line. The light emitting element is disposed on the pixel circuit layer and may include a pixel electrode electrically connected to the pixel circuit layer, an emission layer disposed on the pixel electrode, and a common electrode disposed on the emission layer and extending from the display area toward the non-display area. The pixel defining film may be disposed on the pixel electrode and expose at least a portion of the pixel electrode. The encapsulation layer is disposed on the light emitting element and may include a first inorganic film, an organic film disposed on the first inorganic film, and a second inorganic film disposed on the organic film. The first dam may be disposed between the first inorganic film and the second inorganic film and outside the organic film. The first dam may overlap the non-display area and the pixel defining film on a plane (e.g., in plan view, or along the thickness direction).

The first dam may be directly disposed between the first inorganic film and the second inorganic film.

The display panel may further include a connection electrode. The connection electrode may be to electrically connect the power electrode and the common electrode and an electrode hole may be defined. The first dam may overlap the electrode hole.

The display panel may further include a second dam. The second dam is spaced apart from the first dam, and may be disposed between the first inorganic film and the second inorganic film, and outside the organic film.

A plurality of electrode holes may be defined in the connection electrode. The second dam may overlap at least a portion of the plurality of electrode holes.

The second dam may not overlap the pixel defining film on a plane, and may overlap at least a portion of the power electrode on a plane.

The pixel defining film may fill the electrode hole.

The connection electrode may be disposed on the same layer as the pixel electrode.

The first dam may include a polymer resin, and the polymer resin may include a hydrophobic group having a fluoro group and/or a silyl group.

The polymer resin may include a first repeating unit represented by Formula 1.

[Formula 1]

In Formula 1 above, $R_1$ to $R_3$ may be each independently a hydrogen atom, a deuterium atom, a substituted or unsubstituted alkyl group having 1 to 10 carbon atoms, or a substituted or unsubstituted aryl group having 6 to 20 ring-forming carbon atoms. $m_1$ may be an integer of 0 to 5. $n_1$ may be an integer of 1 to 100.

The first repeating unit may be about 0.1 wt % to about 10 wt % with respect to the total mass of the polymer resin.

The polymer resin may further include at least one of an acrylic repeating unit, an imide repeating unit, an olefin repeating unit, a phenol repeating unit, a siloxane repeating unit, a polyol repeating unit, an ether repeating unit, or a thiol repeating unit. The repeating units may each independently include a substituted or unsubstituted aryl group having 6 to 20 ring-forming carbon atoms.

The acrylic repeating unit may be represented by Formula 2-1, the imide repeating unit may be represented by Formula 2-2, and the olefin repeat unit may be represented by Formula 2-3:

[Formula 1]

[Formula 2-1]

In Formula 1 above, $R_1$ to $R_3$ may each independently be a hydrogen atom, a deuterium atom, a substituted or unsubstituted alkyl group having 1 to 10 carbon atoms, or a substituted or unsubstituted aryl group having 6 to 20 ring-forming carbon atoms. $m_1$ is an integer of 0 to 5. $n_1$ may be an integer of 1 to 100.

The polymer resin may further include at least one of an acrylic repeating unit, an imide repeating unit, an olefin repeating unit, a phenol repeating unit, a siloxane repeating unit, a polyol repeating unit, an ether repeating unit, or a thiol repeating unit. The repeating units may each independently include a substituted or unsubstituted aryl group having 6 to 20 ring-forming carbon atoms.

[Formula 2-2]

The circuit layer may include a pixel circuit layer and a driving circuit layer. The pixel circuit layer may overlap the display area. The driving circuit layer may overlap the non-display area, include a power electrode, and provide a driving signal to the pixel circuit layer. The light emitting element may be disposed on the pixel circuit layer. The light emitting element may include the pixel electrode, an emission layer disposed on the pixel electrode, and a common electrode disposed on the emission layer. The common electrode may extend from the display area toward the non-display area. The display panel may further include a pixel defining film disposed on the pixel electrode and exposing at least a portion of the pixel electrode. The first dam may overlap the non-display area and the pixel defining film on a plane.

[Formula 2-3]

The display panel may further include a connection electrode. The connection electrode may be to electrically connect the power electrode and the common electrode, and a plurality of electrode holes may be defined. The first dam may overlap at least a portion of the plurality of electrode holes.

In Formulae 2-1 to 2-3 above, $R_4$ to $R_{11}$ may each independently be a hydrogen atom, a deuterium atom, a substituted or unsubstituted alkyl group having 1 to 10 carbon atoms, or a substituted or unsubstituted aryl group having 6 to 20 ring-forming carbon atoms. $m_2$ may be an integer of 0 to 5. $n_2$ to $n_4$ may be each independently an integer of 1 to 100.

The display panel may further include a second dam disposed on the same layer as the first dam. The second dam may overlap the pixel defining film on a plane.

The display panel may further include a second dam that does not overlap the pixel defining film on a plane.

The first inorganic film may include at least one of silicon oxide, silicon nitride, or silicon nitride oxide. The organic film may include an organic polymer having a hydrophilic repeating unit.

In an embodiment of the present disclosure, the display panel may include a base layer, a circuit layer, a light emitting element, an encapsulation layer, and a first dam. A display area and a non-display area adjacent to the display area may be defined in the base layer. The circuit layer may be disposed on the base layer. The light emitting element may be disposed on the circuit layer. The encapsulation layer may be disposed on the light emitting element. The encapsulation layer may include a first inorganic film, an organic film disposed on the first inorganic film, and a second inorganic film disposed on the organic film. The first dam may be directly disposed between the first inorganic film and the second inorganic film and may overlap the non-display area. The first dam may include a polymer resin having a first repeating unit represented by Formula 1.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

It will be understood that when an element (or region, layer, part, etc.) is referred to as being "on", "connected to," or "coupled to" another element, it can be directly on, connected or coupled to the other element or intervening elements may be present.

In addition, it will also be understood that when an element is referred to as being disposed "above" another part, it can be disposed above or beneath another part.

Like numbers refer to like elements throughout, and duplicative descriptions thereof may not be provided. The thicknesses, ratios, and dimensions of elements may be exaggerated in the drawings for an effective description of technical contents.

The term "and/or" includes all combinations of one or more of elements from a list, which associated configurations may define.

It will be understood that, although the terms "first", "second", etc. may be used herein to describe various elements, the elements should not be limited by these terms. These terms are only used to distinguish one element from another. For example, a first element could be alternatively termed a second element, and, similarly, a second element could be alternatively termed a first element, without departing from the scope of example embodiments of the present disclosure. The terms of a singular form may include plural forms unless the context clearly indicates otherwise.

In addition, terms such as "below," "lower," "above," "upper," and/or the like are used to describe the relationship of the configurations shown in the drawings. The terms are used as a relative concept and are described with reference to the direction indicated in the drawings.

As used herein, the singular forms "a," "an," and "the" are intended to include the plural forms as well, unless the context clearly indicates otherwise. Further, the use of "may" when describing embodiments of the present disclosure refers to "one or more embodiments of the present disclosure".

Unless otherwise defined, all terms (including technical and scientific terms) used herein have the same meaning as commonly understood by those of ordinary skill in the relevant art. It will also be understood that terms defined in commonly used dictionaries should be interpreted as having meanings consistent with the meanings in the context of the related art, and are expressly defined herein unless they are interpreted in an ideal or overly formal sense.

It should be understood that the terms include," "including," "comprise", "comprising," and/or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments of the present disclosure will be described with reference to the accompanying drawings.

Figure 1:
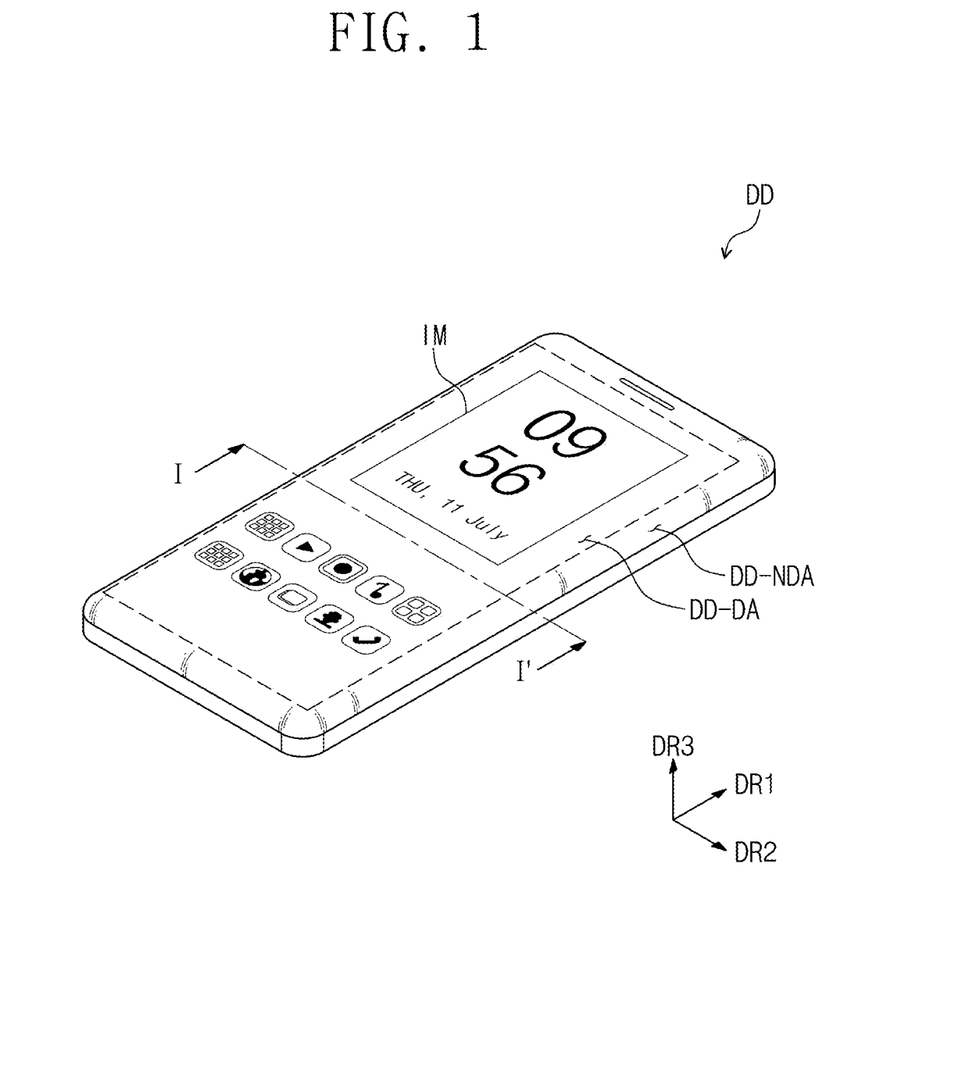
FIG. 1 is a perspective view of a display device according to an embodiment of the present disclosure.

FIG. 1 is a perspective view of a display device according to an embodiment of the present disclosure.

In FIG. 1, a mobile phone in which all four edges are curved is illustrated as an example of a display device DD. However, embodiments of the present disclosure are not limited thereto, and the present disclosure may be applied to any suitable display device DD (such as a flat display device, a curved display device, a bending display device, a rollable display device, a foldable display device, and/or a stretchable display device). In addition, although not specifically illustrated, the display device DD according to the present disclosure may be used in large-sized electronic devices (such as a television set and/or an outdoor billboard), and also used in small and medium-sized electronic devices (such as a personal computer, a laptop computer, a personal digital assistant, a car navigation unit, a game console, a portable electronic device, a wrist watch-type electronic device, and/or a camera). These are provided as examples, and similar display devices may be employed in other electronic devices without departing from the present disclosure.

The display device DD includes a plurality of distinct areas on a display surface. The display device DD may include a display area DD-DA where images IM are displayed, and a non-display area DD-NDA adjacent to the display area DD-DA. In FIG. 1, a clock widget is illustrated as an example of an image IM. The non-display area DD-NDA may surround the display area DD-DA.

In an embodiment, a front surface (or an upper surface) and a rear surface (or a lower surface) of each member may be defined by the direction in which the image IM is displayed. The front and rear surfaces may face away from each other in a third direction DR3, and the normal direction to each of the front and rear surfaces may be parallel to the third direction DR3. Meanwhile, the directions indicated by the first to third directions DR1, DR2, and DR3 are relative concepts, and may thus be converted to (e.g., equivalently termed as) other directions. Hereinafter, the first to third directions are respectively indicated by DR1, DR2, and DR3. In the present specification, "on a plane" may refer to an orientation as viewed from the third direction DR3, for example, the normal direction. For example, elements described as overlapping on a plane may overlap when viewed in plan view so that one covers at least a portion of the other, and may be alternately described as "vertically overlapping" or "overlapping along a thickness direction of the display panel". In contrast, elements described as not overlapping on a plane may not overlap each other when viewed in plan view.

Figure 2:
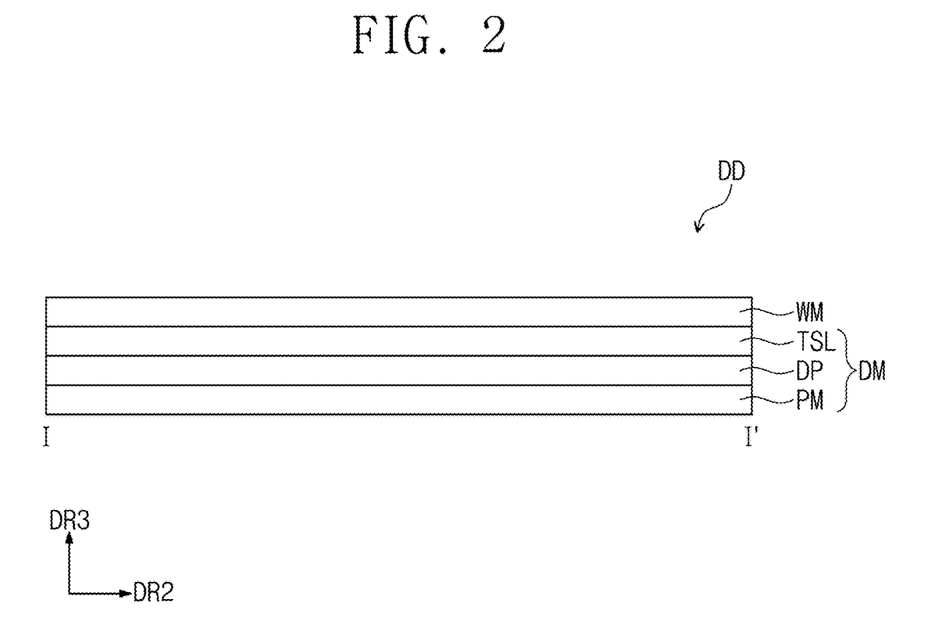
FIG. 2 is a schematic cross-sectional view of a display device taken along line I-I' in FIG. 1.

FIG. 2 is a schematic cross-sectional view of a display device taken along line I-I' in FIG. 1.

As illustrated in FIG. 2, the display device DD may include a display module DM and a window WM disposed on the display module DM. The display module DM may include a protective film PM, a display panel DP, and an input sensing layer TSL.

The protective film PM protects the display module DM. The protective film PM may prevent or reduce external moisture from permeating into the display module DM, and may absorb or reduce external impacts.

The protective film PM may include a plastic (e.g., polymer) resin. However, materials constituting the protective film PM are not limited to plastic resins, and for example, the protective film PM may include organic/inorganic composite materials. The protective film PM may include a porous organic layer and/or an inorganic material filled in pores of the organic layer. In some embodiments, the protective film PM may further include a functional layer formed on a plastic film. For example, the functional layer may include a resin layer. The functional layer may be formed by a coating method. In an embodiment of the present disclosure, the protective film PM may be omitted.

The display panel DP may be disposed on the protective film PM. The display panel DP of an embodiment may include a first dam DM1 (FIG. 5) including a polymer resin containing a hydrophobic group. The display panel DP will be described in more detail later.

The input sensing layer TSL may be disposed on the display panel DP. For example, the input sensing layer TSL according to an embodiment of the present disclosure may detect a change in capacitance caused by an external object to detect an external input.

Figure 3:
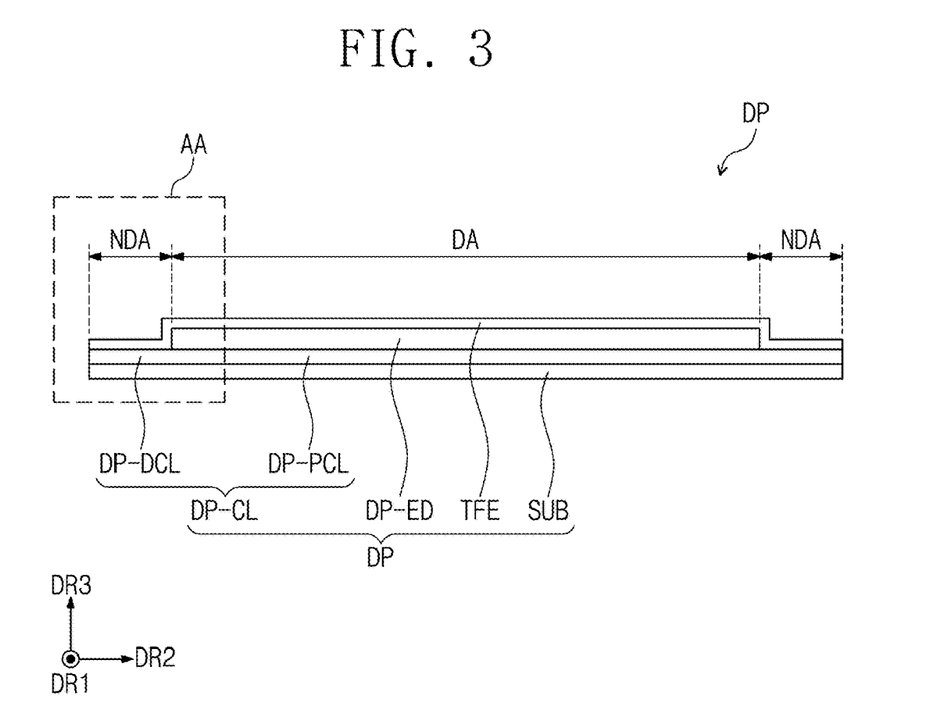
FIG. 3 is a schematic cross-sectional view of a display panel according to an embodiment of the present disclosure.

In some embodiments, the input sensing layer TSL may be directly disposed on an encapsulation layer TFE (FIG. 3), which will described later. For example, a separate (additional) adhesive layer may not be disposed between the input sensing layer TSL and the encapsulation layer TFE (FIG. 3). However, embodiments are not limited thereto, and in some embodiments a protective layer may be disposed on the encapsulation layer TFE (FIG. 3), and the input sensing layer TSL may be directly disposed on the protective layer. The protective layer may be or include an inorganic layer and/or an organic layer. The inorganic layer may include at least one of silicon oxide, silicon nitride, or silicon oxy nitride. The organic layer may include a polymer. However, this is just an example and embodiments are not limited thereto. Although the protective layer has been described as a separate configuration (e.g., as being a distinct layer), the protective layer may be a configuration (e.g., sub-layer) included in the encapsulation layer TFE (FIG. 3).

The window WM may be disposed on the display module DM. The window WM may protect the display module DM from external impacts and/or provide an input surface to a user. The window WM may be or include a plastic film. In some embodiments, the window WM may have a multilayer structure. For example, the window WM may have a multilayer structure where each layer is independently selected from a glass substrate, a plastic film, and a plastic substrate. In some embodiments, the window WM may further include a bezel pattern. The multilayer structure may be formed through a substantially continuous (e.g. integrated) process or through an adhesive process using an adhesive layer.

Each member of the display device DD may be bonded to one or more other members by an adhesive member. For example, they may each be bonded by an optically transparent adhesive member.

FIG. 3 is a schematic cross-sectional view of a display panel according to an embodiment of the present disclosure.

Referring to FIG. 3, the display panel DP includes a base layer SUB, a circuit layer DP-CL disposed on the base layer SUB, a light emitting element layer DP-ED, and an encapsulation layer TFE.

The display panel DP includes a display area DA and a non-display area NDA on a plane. The display area DA and the non-display area NDA of the display panel DP respectively correspond to a display area DD-DA (FIG. 1) and a non-display area DD-NDA (FIG. 1) of the display device DD (FIG. 1). However, the display area DA and the non-display area NDA of the display panel DP are not necessarily the same as the display area DD-DA (FIG. 1) and the non-display area DD-NDA (FIG. 1) of the display device DD (FIG. 1), and may be changed according to the structure and design of the display panel DP in other embodiments.

The base layer SUB may include at least one plastic film. The base layer SUB may be a flexible substrate, and may be or include a plastic substrate, a glass substrate, a metal substrate, and/or an organic/inorganic composite substrate. The plastic substrate may include at least one of an acrylic resin, a methacrylic resin, a polyisoprene, a vinyl resin, an epoxy resin, an urethane resin, a cellulose resin, a siloxane resin, a polyimide resin, a polyamide resin, or a perylene resin.

The circuit layer DP-CL may be disposed on the base layer SUB. The circuit layer DP-CL may include a plurality of insulating layers, a plurality of conductive layers, and/or a semiconductor layer. The plurality of conductive layers of the circuit layer DP-CL may constitute signal lines and/or a control circuit associated with a pixel. The circuit layer DP-CL may include a pixel circuit layer DP-PCL disposed on the display area DD-DA and a driving circuit layer DP-DCL disposed on the non-display area DD-NDA (e.g., in the same plane).

Figure 5:
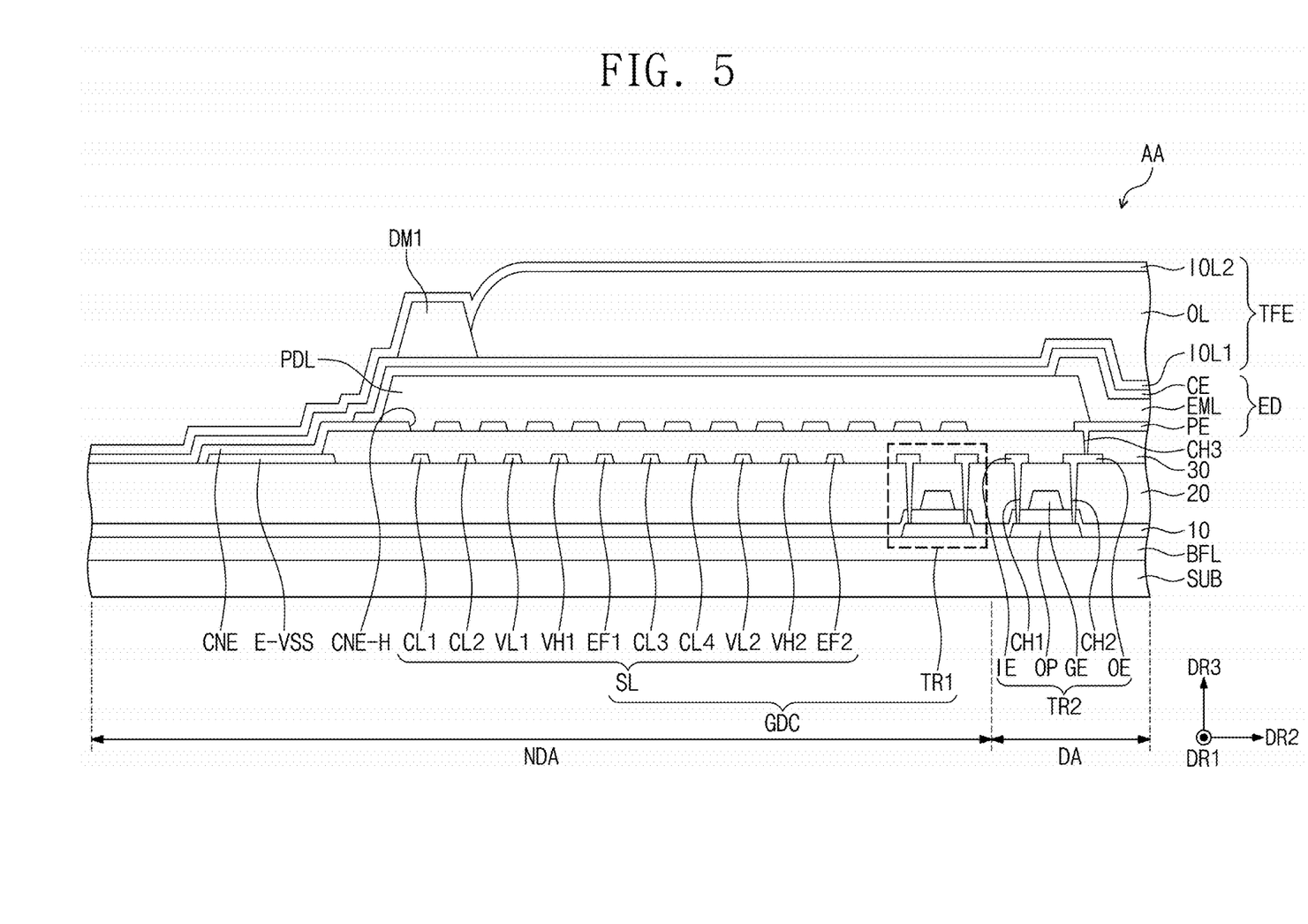
FIG. 5 is a cross-sectional view of a display panel illustrating an enlarged region AA of FIG. 3.

The light emitting element layer DP-ED may be disposed on the circuit layer DP-CL. The light emitting element layer DP-ED includes a light emitting element ED (FIG. 5).

The encapsulation layer TFE may be disposed on the circuit layer DP-CL and the light emitting element layer DP-ED. The encapsulation layer TFE may seal the circuit layer DP-CL and the light emitting element layer DP-ED. The encapsulation layer TFE may include a plurality of inorganic thin films and at least one organic thin film disposed therebetween. The inorganic thin films may protect the light emitting element layer DP-ED from moisture and/or oxygen, and the organic thin film may protect the light emitting element layer DP-ED from foreign materials (such as dust particles). The encapsulation layer TFE will be described later in more detail.

Figure 4:
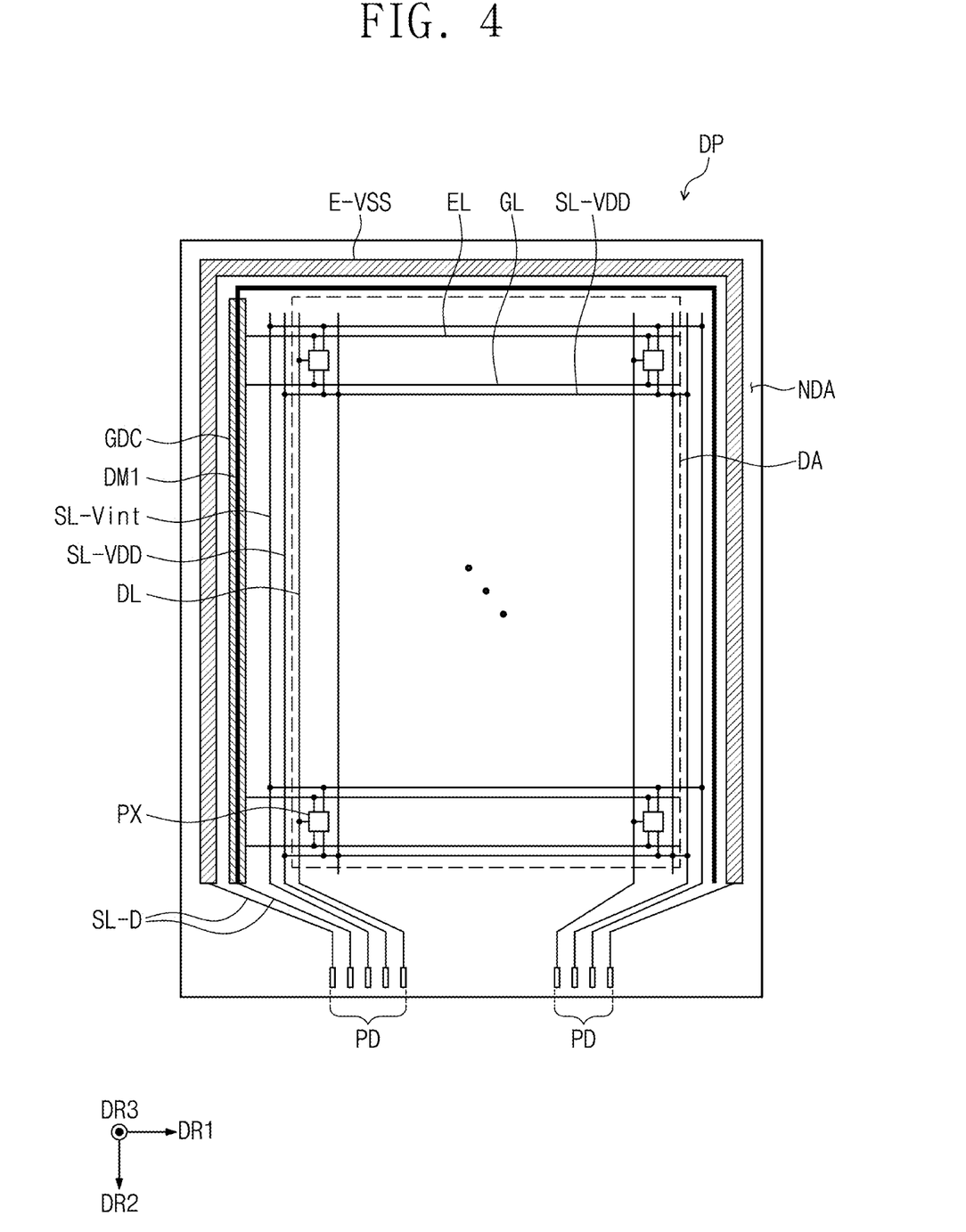
FIG. 4 is a plan view of a display panel according to an embodiment of the present disclosure.

FIG. 4 is a plan view of a display panel according to an embodiment of the present disclosure.

Referring to FIG. 4, the display panel DP may include a plurality of pixels PX. The area in which the plurality of pixels PX are disposed may be defined as the display area DA. In this embodiment, the non-display area NDA may be defined along the outline of the display area DA.

The display panel DP may include gate lines GL, data lines DL, emission lines EL, control signal lines SL-D, initialization voltage lines SL-Vint, voltage lines SL-. VDD, a power electrode E-VSS, and a pad part (portion) PD.

The gate lines GL are respectively connected to corresponding pixels PX of the plurality of pixels PX, and the data lines DL are respectively connected to corresponding pixels PX of the plurality of pixels PX. Each of the emission lines EL may be arranged parallel to a corresponding gate line GL. The control signal line SL-D may provide control signals to a gate driving circuit GDC. The initialization voltage line SL-Vint may provide an initialization voltage to the plurality of pixels PX. The voltage line SL-VDD is connected to the plurality of pixels PX and may provide a first voltage to the plurality of pixels PX. The voltage line SL-VDD may include a plurality of lines extending in the first direction DR1 and a plurality of lines extending in the second direction DR2. The power electrode E-VSS may be disposed in the non-display area NDA, and may be disposed to surround the three side surfaces of the display area DA. The power electrode E-VSS may provide a common voltage (e.g. a second voltage) to the plurality of pixels PX. In some embodiments, the common voltage may have a lower voltage level than the first voltage.

The gate driving circuit GDC connected to the gate lines GL and the emission lines EL may be disposed on one side of the non-display area NDA.

The pad part PD may be connected to ends of the data lines DL, the control signal line SL-D, the initialization voltage line SL-Vint, and the voltage line SL-VDD.

FIG. 4 illustrates that the first dam DM1 surrounds three surfaces of the display area DA, but embodiments are not limited thereto. The first dam DM1 may be disposed to surround at least one surface of the display area DA, and for example, the first dam DM1 may be disposed to surround all four surfaces of the display area DA. The first dam DM1 may be disposed to overlap the non-display area NDA on a plane. The first dam DM1 may be disposed to overlap the gate driving circuit GDC on the gate driving circuit GDC.

FIG. 5 is a cross-sectional view of a display panel illustrating an enlarged region AA of FIG. 3.

Referring to FIG. 5, a buffer layer BFL may be disposed on the base layer SUB. The buffer layer BFL may improve the bonding force between the base layer SUB and conductive patterns or semiconductor patterns. The buffer layer BFL may include an inorganic layer. In some embodiments, a barrier layer to prevent or reduce foreign matters from entering may be further disposed on the upper surface of the base layer SUB. The buffer layer BFL and the barrier layer may be selectively disposed or omitted.

The circuit layer DP-CL (FIG. 3) may be disposed on the base layer SUB. Referring to FIG. 5, the circuit layer DP-CL (FIG. 3) may include a plurality of insulating layers, a plurality of conductive layers, and/or a semiconductor layer. The plurality of conductive layers of the circuit layer DP-CL (FIG. 3) may constitute signal lines or a control circuit of or a pixel. The circuit layer DP-CL (FIG. 3) may include the pixel circuit layer DP-PCL (FIG. 3) disposed in the display area DA and the driving circuit layer DP-DCL (FIG. 3) disposed in the non-display area NDA.

The driving circuit layer DP-DCL (FIG. 3) may include a gate driving circuit GDC and a power electrode E-VSS. The gate driving circuit GDC may include a plurality of driving signal lines SL and a first transistor TR1. The plurality of driving signal lines SL may include a first clock signal line CL1, a second clock signal line CL2, a third clock signal line CL3, a fourth clock signal line CL4, a first voltage line VL1, a second voltage line VH1, a third voltage line VL2, a fourth voltage line VH2, a first start signal line EF1, and a second start signal line EF2.

The pixel circuit layer DP-PCL (FIG. 3) may include a plurality of transistors. As an example, FIG. 5 illustrates a second transistor TR2 among the plurality of transistors. The second transistor TR2 may include a semiconductor pattern OP, a control (e.g., gate) electrode GE, an input electrode IE, and an output electrode OE. The semiconductor pattern OP may be disposed on the buffer layer BFL. The semiconductor pattern OP may include at least one of amorphous silicon, polysilicon, or a metal oxide.

A first insulating layer 10 may be disposed on the semiconductor pattern OP. Although the embodiment of FIG. 5 illustrates that the first insulating layer 10 is provided in the form of a layer covering the semiconductor pattern OP, embodiments of the present disclosure are not limited thereto.

The first insulating layer 10 may include a plurality of inorganic thin films. The plurality of inorganic thin films may include a silicon nitride layer, a silicon oxy nitride layer, and/or a silicon oxide layer.

The control electrode GE of the second transistor TR2 may be disposed on the first insulating layer 10. The control electrode GE may be manufactured according to the same photolithography process as the gate lines GL (FIG. 4).

A second insulating layer 20 covering the control electrode GE may be disposed on the first insulating layer 10. The second insulating layer 20 may provide a flat upper surface. The second insulating layer 20 may include an organic material and/or an inorganic material.

The input electrode IE and the output electrode OE of the second transistor TR2 may be disposed on the second insulating layer 20. The input electrode IE and the output electrode OE are respectively connected to the semiconductor pattern OP through a first through hole CH1 and a second through hole CH2, which pass through both of the first insulating layer 10 and the second insulating layer 20 (e.g., simultaneously).

In some embodiments, the transistor TR1 and/or TR2 may be modified to have a bottom gate structure.

The power electrode E-VSS and the plurality of driving signal lines SL may be disposed on the second insulating layer 20. For example, the power electrode E-VSS, the first clock signal line CL1, the second clock signal line CL2, the third clock signal line CL3, and the fourth clock signal line CL4, the first voltage line VL1, the second voltage line VH1, the third voltage line VL2, the fourth voltage line VH2, the first start signal line EF1, and the second start signal line EF2 may be disposed on the second insulating layer 20.

A third insulating layer 30 covering the input electrode IE, the output electrode OE, and the plurality of driving signal lines SL may be disposed on the second insulating layer 20. The third insulating layer 30 may cover a portion of the power electrode E-VSS. The third insulating layer 30 may include an organic layer and/or an inorganic layer. For example, the third insulating layer 30 may include an organic material to provide a flat surface.

Any one of the first insulating layer 10, the second insulating layer 20, and the third insulating layer 30 may be omitted, depending on the circuit structure of the pixel. Each of the second insulating layer 20 and the third insulating layer 30 may be an interlayer insulating layer. As referred to herein, an interlayer insulating layer is disposed between a lower conductive pattern and an upper conductive pattern to thereby insulate the conductive patterns from each other.

A pixel defining film PDL and a light emitting element ED may each be disposed on the third insulating layer 30. The light emitting element ED may be disposed in the display area DA. The light emitting element ED may include a pixel electrode PE, an emission layer EML, and a common electrode CE, stacked in that order.

The pixel electrode PE may be disposed on the third insulating layer 30. The pixel electrode PE may be electrically connected to the pixel circuit layer DP-PCL. For example, the pixel electrode PE may be connected to the output electrode OE through a third through hole CH3 passing through the third insulating layer 30.

The pixel defining film PDL may be disposed on the third insulating layer 30. The pixel defining film PDL may cover at least a portion of the pixel electrode PE and may expose another portion of the pixel electrode PE. In some embodiments, the pixel defining film PDL may be disposed among the plurality of light emitting elements ED to prevent or reduce mixing of the light emitted from each of the light emitting elements ED. In some embodiments, the pixel defining film PDL may be disposed in a portion of the non-display area NDA (as illustrated). The pixel defining film PDL may insulate the connection electrode CNE.

The emission layer EML may be disposed on the pixel electrode PE. The emission layer EML may include an organic emission material. However, embodiments are not limited thereto, and the emission layer EML may include an inorganic material as an emission material. For example, a quantum dot may be included as an emission material.

The common electrode CE may be disposed on the emission layer EML. The common electrode CE may be electrically connected to the power electrode E-VSS. The common electrode CE may receive a power voltage from the power electrode E-VSS. The common electrode CE may extend from the display area DA toward the non-display area NDA. The common electrode CE may be disposed on the plurality of clock signal lines CL1, CL2, CL3, and CL4 (hereinafter collectively referred to as CL). A portion of the common electrode CE extending toward the non-display area NDA may be disposed on the pixel defining film PDL.

In some embodiments, at least one of a hole injection layer, a hole transport layer, or an electron blocking layer may be disposed between the pixel electrode PE and the emission layer EML. In some embodiments, at least one of an electron injection layer, an electron transport layer, or a hole blocking layer may be disposed between the emission layer EML and the common electrode CE. Holes and electrons respectively injected from the pixel electrode PE and the common electrode CE of the light emitting element ED may meet to form an exciton, and light may be emitted when the exciton falls to the ground state.

The common electrode CE and the power electrode E-VSS may be electrically connected to each other by the connection electrode CNE. The connection electrode CNE may be disposed to overlap the non-display area NDA. The connection electrode CNE may be disposed not to overlap the display area DA. The connection electrode CNE may be directly disposed on the power electrode E-VSS. The connection electrode CNE may be disposed to extend toward the display area DA between the third insulating layer 30 and the pixel defining film PDL. A portion of the connection electrode CNE may be disposed on the power electrode E-VSS and the other portion of the connection electrode CNE may be disposed on the same layer as the pixel electrode PE. For example, a portion of the connection electrode CNE and the pixel electrode PE may be disposed on the third insulating layer 30. The connection electrode CNE and the pixel electrode PE may be deposited via the same process, and/or may be formed of the same material.

At least one electrode hole CNE-H may be defined in the connection electrode CNE. For example, at least one electrode hole CNE-H may be defined in a portion of the connection electrode CNE overlapping the pixel defining film PDL. The electrode hole CNE-H may be provided in plurality. In some embodiments, the electrode hole CNE-H may be filled with an insulating material. For example, the electrode holes CNE-H may be filled with the pixel defining film PDL. In some embodiments, the electrode hole CNE-H may not be filled with a conductive material.

In an embodiment, gas generated during the process (e.g., deposition or fabrication processes) may be discharged to the outside through the electrode holes CNE-H. For example, hydrogen may be generated in the first to third insulating layers 10, 20, and 30 during the process. When hydrogen is not discharged, the hydrogen may be absorbed in the semiconductor layer of the first transistor TR1. Because hydrogen serves as a carrier, it may cause a defect in the first transistor TR1. However, in an embodiment, hydrogen may be discharged to the outside and outgassed through the electrode hole(s) CNE-H.

The common voltage may be provided to the connection electrode CNE. Therefore, noise generated between the clock signal lines CL and the input sensing layer TSL (FIG. 3) may be blocked by the connection electrode CNE.

An encapsulation layer TFE may be disposed on the light emitting element ED. The encapsulation layer TFE may be directly disposed on the light emitting element ED to seal the light emitting element. FIG. 5 illustrates that the encapsulation layer TFE is directly disposed on the common electrode CE. However, embodiments are not limited thereto. In some embodiments, for example, the light emitting element ED may further include a capping layer disposed on the common electrode CE. In some embodiments, the capping layer may be an optical functional layer that adjusts the refractive index of the light emitted from the emission layer EML and/or adjusts the resonance distance of the light. In this case, the encapsulation layer TFE may be directly disposed on the capping layer.

The encapsulation layer TFE may have a multilayer structure including a first inorganic film IOL1, an organic film OL, and a second inorganic film IOL2. The first inorganic film IOL1, the organic film OL, and the second inorganic film IOL2 may each independently have a single layer or a multilayer structure.

The first inorganic film IOL1 may include at least one of silicon oxide, silicon nitride, or silicon oxy nitride. The first inorganic film IOL1 may be a hydrophilic group including at least one of silicon oxide, silicon nitride, or silicon oxy nitride.

The organic film OL may include an organic polymer including a hydrophilic repeating unit. For example, the organic film OL may include or be formed of an acrylic resin, an epoxy resin, or an imide organic polymer.

The first dam DM1 may be disposed between the first inorganic film IOL1 and the second inorganic film IOL2. In some embodiments, the first dam DM1 may be directly disposed between the first inorganic film IOL1 and the second inorganic film IOL2. In some embodiments, the first dam DM1 may be disposed outside the organic film OL. For example, the first dam DM1 may be positioned alongside the organic film OL on the same plane, or for example, to form a perimeter around the outer edge of the organic film OL.

The first dam DM1 may overlap the non-display area NDA. In some embodiments, the first dam DM1 may be disposed to overlap the pixel defining film PDL on a plane. In some embodiments, the first dam DM1 may be disposed to overlap the electrode hole CNE-H. In some embodiments, the first dam DM1 may be disposed to overlap at least a portion of the plurality of electrode holes CNE-H.

The first dam DM1 may include or be formed of a polymer resin. The polymer resin may be formed by polymerizing a first compound and a second compound. The first compound may be an acrylic compound including a fluoro (F) group and/or a silyl group. The first compound may be a monomer, an oligomer, or a polymer.

For example, the first dam DM1 may include the first compound, which is a first repeating unit (monomer) represented by Formula 1:

[Formula 1]

In Formula 1, $R_1$ to $R_3$ may each independently be a hydrogen atom, a deuterium atom, a substituted or unsubstituted alkyl group having 1 to 10 carbon atoms, or a substituted or unsubstituted aryl group having 6 to 20 ring-forming carbon atoms. In some embodiments, for example, $R_1$ to $R_3$ may each independently be a hydrogen atom or a methyl group.

$m_1$ may be an integer of 0 to 5. $n_1$ may be an integer of 1 to 100. In some embodiments, for example, $m_1$ may be an integer of 0 to 3. When $m_1$ is 0, the $CF_3$ group is directly linked to the ester oxygen atom.

The first repeating unit represented by Formula 1 may be represented by Formula 1-1:

[Formula 1-1]

In Formula 1-1, $m_1$ and $n_1$ may each independently be the same as defined in Formula 1.

The second compound may be a polymer. In some embodiments, the second compound may be a binder polymer. In some embodiments, the second compound may be or include at least one of an acrylic compound, an imide compound, an olefin compound, a phenol compound, a siloxane compound, an ether compound, or a thiol compound. The acrylic compound may be an epoxy acrylic compound. The olefin compound may be a styrene compound or a cardo compound. The imide compound may be a maleimide compound. Accordingly, the first dam may include or be formed of a polymeric resin containing at least one of an acrylic repeating unit, an imide repeating unit, an olefin repeating unit, a phenol repeating unit, a siloxane repeating unit, a polyol repeating unit, an ether repeating unit, or a thiol repeating unit.

In the polymerization of the polymer resin of an embodiment, the first compound may be included in an amount of about 0.1 wt % to about 10 wt %, or about 1 wt % to about 10 wt % with respect to the total mass of reactants for forming the polymer resin. When the content of the first compound is less than about 0.1 wt %, the hydrophobicity of the first dam DM1 may be weakened, so that the organic monomers may overflow the first dam. When the content of the first compound exceeds about 10 wt %, forming the first dam DM1 may be difficult because the glass transition temperature Tg of the first dam DM1 is lowered. As used herein, "wt %" substantially refers to mass %.

The second compound may include a substituted or unsubstituted aryl group having 6 to 20 ring-forming carbon atoms. In some embodiments, for example, the substituted or unsubstituted aryl group having 6 to 20 ring-forming carbon atoms may be a substituted or unsubstituted phenyl group.

For example, the first dam DM1 may include at least one of the repeating units represented by Formulae 2-1 to 2-3:

[Formula 2-1]

[Formula 2-2]

[Formula 2-3]

Formula 2-1 illustrates an example acrylic repeating unit, Formula 2-2 illustrates an example imide repeating unit, and Formula 2-3 illustrates an example olefin repeating unit.

In Formulae 2-1 to 2-3, $R_4$ to $R_{11}$ may each independently be a hydrogen atom, a deuterium atom, a substituted or unsubstituted alkyl group having 1 to 10 carbon atoms, or a substituted or unsubstituted aryl group having 6 to 20 ring-forming carbon atoms. In some embodiments, for example, $R_4$ to $R_{11}$ may each independently be a hydrogen atom or a methyl group.

$m_2$ may be an integer of 0 to 5. $n_2$ to $n_4$ may each independently be an integer of 1 to 100. For example, $m_2$ may be 1.

Formulae 2-1 to 2-3 may each be represented by Formulae 2-1-1 to 2-3-1, respectively:

[Formula 2-1-1]

[Formula 2-2-1]

[Formula 2-3-1]

In Formulae 2-1-1 to 2-3-1, $m_2$ and $n_2$ to $n_4$ may be the same as defined in Formulae 2-1 to 2-3.

In an embodiment, when the polymer resin is polymerized to form the first dam DM1, the glass transition temperature of the polymer resin may be adjusted by controlling the content of the second compound containing a substituted or unsubstituted aryl group having 6 to 20 ring-forming carbon atoms. The content of the second compound including the aryl group may be about 30 wt % to about 70 wt % with respect to the total weight of materials in the first dam DM1. When the content of the second compound satisfies the above-described range, the first dam DM1 may be formed to have an appropriate or suitable glass transition temperature.

The second compound may further include at least one of a developer, a photo-curing agent, or a thermosetting agent. For example, the second compound may further include a developer and a photo-curing agent, further include a developer and a thermosetting agent, or further include all of a developer, a photo-curing agent, and a thermosetting agent. The developer, the photo-curing agent, and the thermosetting agent are not specifically limited, and for example, the developer may be a compound including a carboxy group, the photo-curing agent may be a compound including an ester group, and the thermosetting agent may be an epoxy acrylic compound.

For example, the developer may be represented by Formula 3-1, the photo-curing agent may be represented by Formula 3-2, and the thermosetting agent may be represented by Formula 3-3:

[Formula 3-1]

[Formula 3-2]

[Formula 3-3]

In Formulae 3-1 to 3-3, $n_5$ to $n_7$ may each independently be an integer of 1 to 100.

The content of the developer, the photo-curing agent, and/or the thermosetting agent may be about 30 wt % to about 70 wt % with respect to the total weight of the first dam DM1.

The first dam DM1 may include a polymer resin formed by photo-curing. For example, the first dam DM1 may be formed by photo-curing a mixture including the first compound, the second compound, and a photoinitiator. Although the type of photoinitiator is not specifically limited, the photoinitiator may include any one of an oxime-based photoinitiator, an acetophenone-based photoinitiator, an imidazole-based photoinitiator, or a sulfonium salt-based photoinitiator.

The first dam DM1 may be formed from a group containing a first compound, a second compound, a photoinitiator, a cross-linking agent, and a surfactant. The first dam DM1 may be formed from a group containing a first compound, a second compound, a monomer, a photoinitiator, and a surfactant.

The surfactant may be a fluorine-based, silyl-based, phenol-based, or POE (PolyOlefin Elastomer)-based surfactant. The amount of the surfactant may be about 0.1 wt % to about 10 wt % with respect to the total weight of the first dam DM1.

The fluorine-based surfactant may be F-470, F-471, F-475, F-482, or F-489, etc. (available from Dainippon Ink and Chemicals, Inc.).

The silyl-based surfactant may be or include at least one of (3-glycidoxypropyl) trimethoxysilane, (3-glycidoxypropyl) triethoxysilane, or (3-glycidoxypropyl) methyldimethoxysilane.

The POE-based surfactant may be or include at least one of polyoxyethylene octylphenyl ether or polyoxyethylene nonylphenyl ether.

The phenol-based surfactant may be at least one of 4,4', 4"-methylidinetrisphenol, 4,4', 4"-ethylidinetrisphenol, 4-[bis (4-hydroxyphenyl) methyl]-2-methoxyphenol, 4-[bis (4-hydroxyphenyl) methyl]-2-ethoxyphenol, or 4,4'-[(2-hydroxyphenyl) methylene] bis [2-methylphenol].

The monomer may be a photo-crosslinker, or a thermal crosslinker. The monomer may be an acrylic monomer. For example, the monomer may be at least one of 2-hydroxypropol acrylate (2-hydroxypropol acylate), 2-hydroxymethyl methacrylate, 2-hydroxyethyl methacrylate, methyl methacrylate, ethyl methacrylate, n-butyl methacrylate, sec-butyl methacrylate, tert-butyl methacrylate, methyl acrylate, 1,4-butanediol diacrylate, 1,3-butylene glycol diacrylate, ethylene glycol diacrylate, trimethylolpropanediacrylate, or trimethylolpropanetriacrylate. However, embodiments are not limited thereto, and the monomer may be, for example, an epoxy monomer. The content of the monomer may be about 0.1 wt % to about 10 wt % with respect to the total weight (mass) of materials in the first dam DM1.

The first dam DM1 includes a repeating unit having a hydrophobic group containing a fluoro group or a silyl group. Therefore, the first dam DM1 may present hydrophobicity (e.g., may be hydrophobic).

When forming the encapsulation layer TFE, an organic film OL is formed on the first inorganic film IOL1. Because the organic monomers forming the organic film OL are often hydrophilic, the organic monomers may not spread well on the first inorganic film IOL1, for example when the first inorganic film IOL1 is hydrophobic. The spreadability of the organic monomers in the organic film OL may therefore be improved by forming the first inorganic film IOL1 using materials having hydrophilic properties (such as silicon nitride, silicon oxide, and/or silicon nitride oxide). However, in this case, the organic monomers may flow over the first inorganic film IOL1 to the outside of the first dam DM1. Accordingly, air and/or moisture may penetrate into the exposed organic layer, thereby degrading the durability of the display panel DP.

In the display panel DP according to an embodiment, the first dam DM1 having hydrophobicity is disposed on the first inorganic film IOL1. Therefore, the organic monomers cannot flow over the first dam DM1 due to the surface tension of the first dam DM1 having hydrophobicity. Accordingly, the organic layer may not be exposed, and the durability of the display panel DP may be improved.

In an embodiment, the electrode hole CNE-H may be filled and insulated by the pixel defining film PDL and/or the like. Therefore, the electrode hole CNE-H may be formed to be higher (e.g., taller) than the outermost portion PDL (for example, a portion where the power electrode E-VSS is disposed) of the non-display area NDA that is not insulated by the pixel defining film PDL. Therefore, the first dam DM1 is disposed on the pixel defining film PDL when the pixel defining film PDL is disposed to overlap the electrode hole CNE-H, so that the height of the first dam DM1 is formed low, and thus the monomers may overflow. However, in an embodiment, because the first dam DM1 includes a hydrophobic group containing a fluoro group or a silyl group, hydrophobicity is further improved, and even if the first dam DM1 is formed to overlap the electrode hole CNE-H on a plane, the organic monomers may not overflow. Therefore, in an embodiment, the first dam DM1 is disposed to overlap the pixel defining film PDL and the electrode hole CNE-H on a plane so that the non-display area NDA may be reduced.

Figure 6:
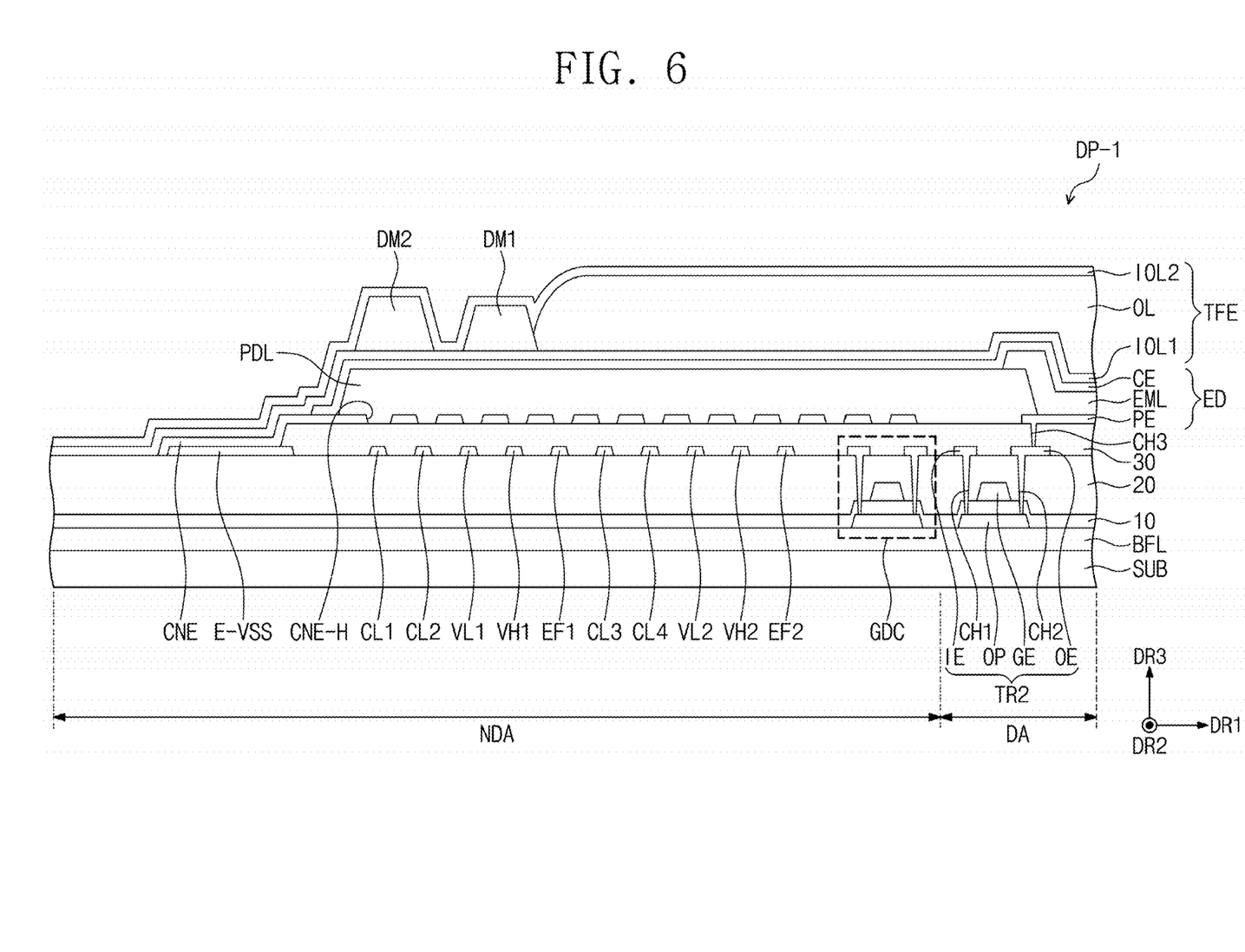
FIG. 6 is a cross-sectional view of a display panel according to an embodiment of the present disclosure.
Figure 7:
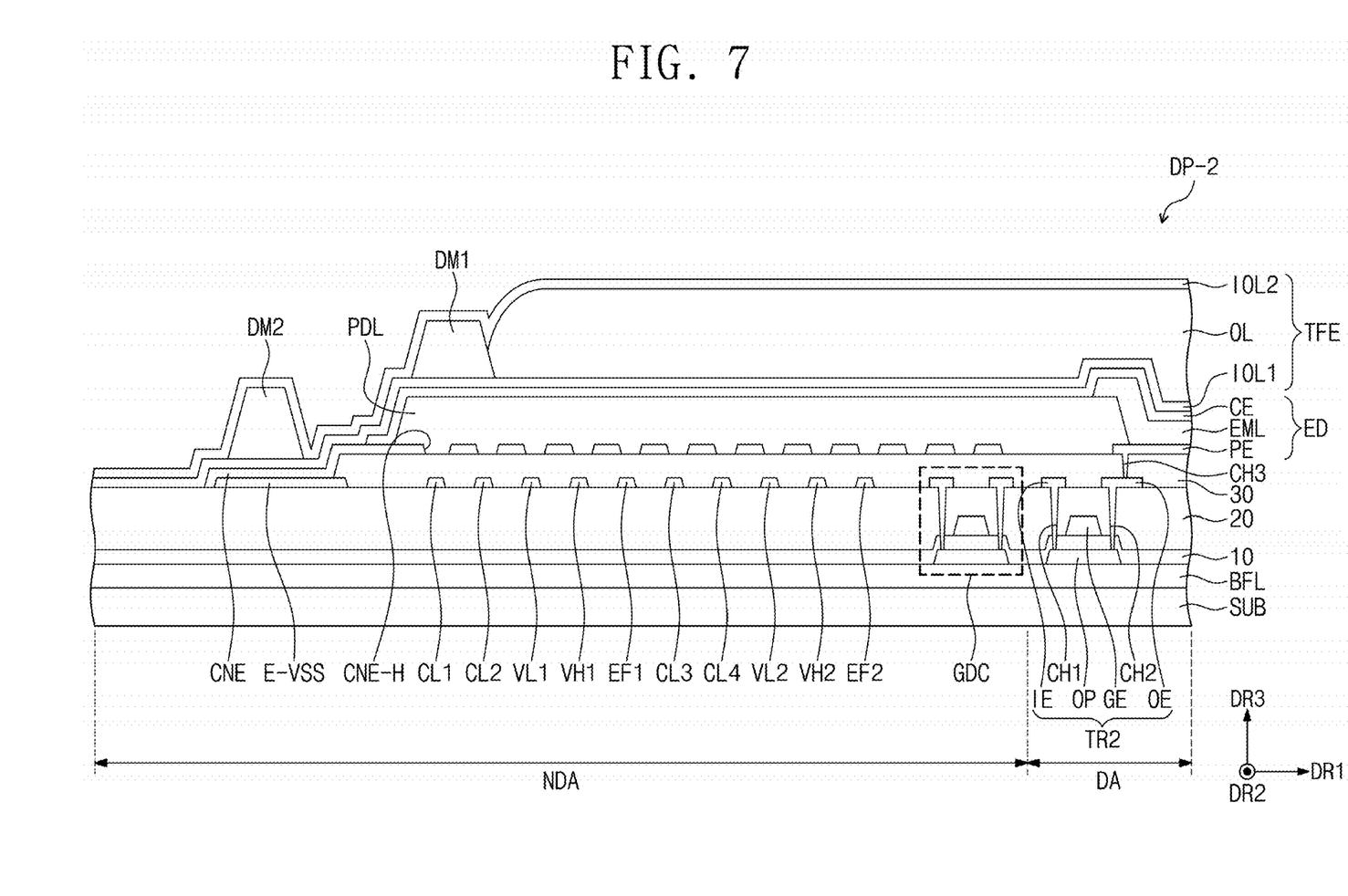
FIG. 7 is a cross-sectional view of a display panel according to an embodiment of the present disclosure.

FIG. 6 is a cross-sectional view of a display panel according to an embodiment of the present disclosure. FIG. 7 is a cross-sectional view of a display panel according to an embodiment of the present disclosure. FIGS. 6 and 7 illustrate cross sections of regions corresponding to cross sections of the display panel of FIG. 5.

Referring to FIGS. 6 and 7, the display panels DP-1 and DP-2 of an embodiment may further include a second dam DM2. The second dam DM2 may be spaced apart from the first dam DM1 and disposed between the first inorganic film IOL1 and the second inorganic film IOL2. In some embodiments, the second dam DM2 may be disposed outside the organic film. In some embodiments, the second dam DM2 may be disposed outside the first dam DM1. In some embodiments, the second dam DM2 may be disposed to be spaced apart (e.g., further apart) from the display area DA than (e.g., compared to) the first dam DM1. The second dam DM2 may further prevent or reduce the organic monomers from overflowing the first dam DM1.

The second dam DM2 may include substantially the same material as the first dam DM1. However, embodiments are not limited thereto, and in some embodiments the second dam DM2 may include a material different from that of the first dam DM1.

Referring to FIG. 6, in the display panel DP-1 of an embodiment, the second dam DM2 may be disposed on the pixel defining film PDL. The second dam DM2 may overlap the electrode hole CNE-H on a plane.

Referring to FIG. 7, in the display panel DP-2 of an embodiment, the second dam DM2 may not overlap the pixel defining film PDL on a plane and may not overlap the electrode hole CNE-H on a plane. The second dam DM2 may be disposed to overlap the power electrode E-VSS on a plane. In an embodiment, even if the second dam DM2 is disposed not to overlap the pixel defining film PDL on a plane, the non-display area NDA may be reduced compared to the case in which the first dam DM1 and the second dam DM2 are both (e.g., simultaneously) disposed not to overlap the pixel defining film PDL on a plane.

Hereinafter, embodiments of dams including a compound according to an embodiment of the present disclosure and the compound will be described in more detail with reference to Examples and Comparative Examples. The Examples shown below are provided as an aid for understanding the present disclosure, and the scope of the present disclosure is not limited thereto.

1. Polymerization and Evaluation of a Polymer Resin Constituting a Dam 1-1. Polymerization of a Polymer Resin Polymerization of a Polymer Resin of Example 1

In order to polymerize a polymer resin of Example 1, as a second compound, 0.34 mol of an acrylic acid monomer (Formula A), 0.6 mol of a vinyl toluene monomer (Formula B), and 0.06 mol of an epoxy monomer (Formula C) were mixed with 150 g of propylene glycol methyl ether acetate (PGMEA). Thereafter, azobisisobutyronitrile (AIBN) was slowly added dropwise to a ratio of 0.05 wt % of the total weight of the solution for 1 hour, and stirred for 5 hours to form a mixed solution. Then, a first compound (Formula D), a crosslinking agent (2-hydroxypropane acrylate), a surfactant (F-470, available from Dainippon Ink and Chemicals, Inc.), and a photoinitiator (2-benzyl-2-(dimethylamino)-1-[4-(4-morpholinyl) phenyl]-1-butanone (product name: Igacure 369) were added to the mixed solution to be stirred and dissolved. At this point, the photoinitiator was added at about 0.5 wt % with respect to the total weight of the reactants. 200 mL of propylene glycol methyl ether acetate (PGMEA) as a solvent was prepared and maintained at a temperature of 100° C. in a flask. Thereafter, the mixed solution including the photoinitiator was added dropwise into the solvent for 12 hours. After addition was complete, the reaction was maintained for another 12 hours and then cooled and filtered to form a first dam of an embodiment.

[Formula A]

[Formula B]

[Formula C]

[Formula D]

Polymerization of a Polymer Resin of Comparative Example 1

The polymer resin of Comparative Example 1 was polymerized in substantially the same manner as used for the polymerization of the polymer resin of Example 1, except that the first compound of an embodiment was not added.

1-2. Evaluation of Liquid Repellency of a Polymer Resin

Figure 8:
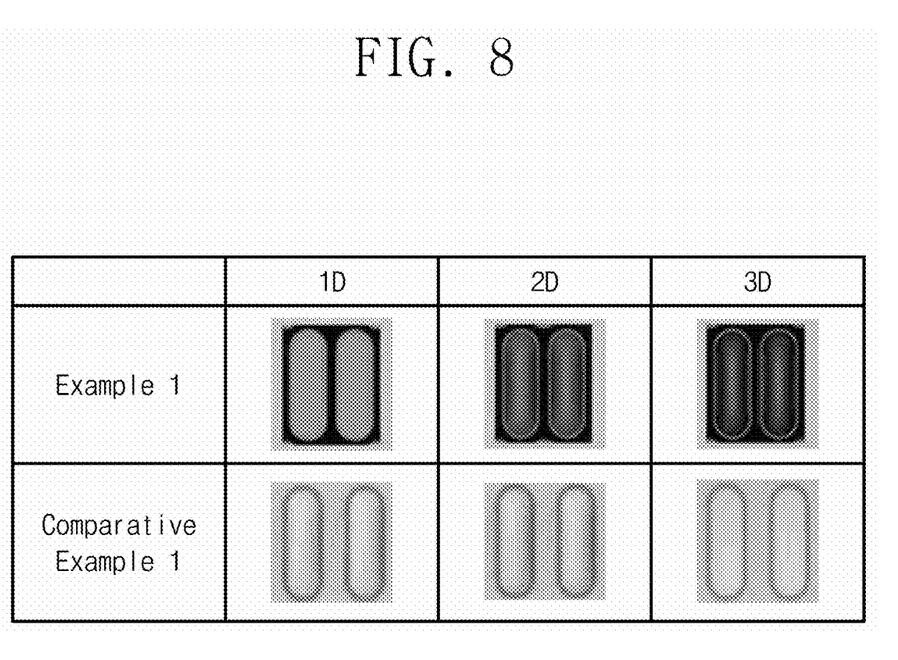
FIG. 8 is a view illustrating the evaluation results of polymer resins of Example 1 and Comparative Example 1.

FIG. 8 is a view illustrating the evaluation results of the polymer resin of Example 1 and Comparative Example 1. "1D" to "3D" refer to examples including one to three drops, respectively, of the organic monomer as deposited on the polymer resin. Referring to FIG. 8, it is confirmed that the polymer resin of the Example turns progressively black as additional amounts of the organic monomers are added. This is because the organic monomers do not spread or flow on the polymer resin of the Example, but are stacked on the polymer resin. In contrast, the polymer resin of the Comparative Example flows without accumulating in the polymer resin when the organic monomers are added, so there is almost no change seen in the photo even when the organic monomer are dropped.

Because the polymer resin of the Example 1 includes the first compound as a co-monomer and has hydrophobicity, it is seen that the polymer resin of the Example has superior liquid repellency. In contrast, the polymer resin of Comparative Example 1 does not include the first compound having a hydrophobic group as a co-monomer, and thus it is seen that the polymer resin of Comparative Example 1 has inferior liquid repellency.

The display panel of an embodiment includes a first dam disposed between the first inorganic film and the second inorganic film and outside the organic film, and overlapping the pixel defining film on a plane. The first dam includes a hydrophobic group containing a fluoro group or a silyl group. Therefore, the non-display area of the display panel of an embodiment may be reduced.

According to an embodiment of the present disclosure, a display panel in which a non-display area is reduced may be provided.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although described with reference to an embodiment, it will be understood that various changes and modifications of the present disclosure can be made by one ordinary skilled in the art within the spirit and scope of the present disclosure as hereinafter claimed. Also, the embodiments disclosed in the present disclosure are not intended to limit the technical ideas of the present disclosure, and all technical ideas within the following claims and their equivalents should be interpreted to be included in the scope of right in the present disclosure.

What is claimed is:

1. A display panel comprising:
  a base layer on which a display area and a non-display area adjacent to the display area are defined;
  a circuit layer on the base layer and comprising: a pixel circuit layer overlapping the display area and a driving circuit layer overlapping the non-display area and having a power electrode and a driving signal line;
  a light emitting element on the pixel circuit layer and comprising a pixel electrode electrically connected to the pixel circuit layer, an emission layer on the pixel electrode, and a common electrode on the emission layer and extending from the display area toward the non-display area;
  a pixel defining film on the pixel electrode and exposing at least a portion of the pixel electrode;
  an encapsulation layer on the light emitting element and comprising a first inorganic film, an organic film on the first inorganic film, and a second inorganic film on the organic film; and
  a first dam between the first inorganic film and the second inorganic film, outside the organic film, and overlapping the non-display area and the pixel defining film on a plane, the first dam being in direct contact with the first inorganic film and the second inorganic film.

2. A display panel comprising:
a base layer on which a display area and a non-display area adjacent to the display area are defined;
a circuit layer on the base layer and comprising: a pixel circuit layer overlapping the display area and a driving circuit layer overlapping the non-display area and having a power electrode and a driving signal line;
a light emitting element on the pixel circuit layer and comprising a pixel electrode electrically connected to the pixel circuit layer, an emission layer on the pixel electrode, and a common electrode on the emission layer and extending from the display area toward the non-display area;
a pixel defining film on the pixel electrode and exposing at least a portion of the pixel electrode;
an encapsulation layer on the light emitting element and comprising a first inorganic film, an organic film on the first inorganic film, and a second inorganic film on the organic film;
a first dam between the first inorganic film and the second inorganic film, outside the organic film, and overlapping the non-display area and the pixel defining film on a plane; and
a connection electrode that electrically connects the power electrode and the common electrode, and in which an electrode hole is defined,
wherein the first dam overlaps the electrode hole.

3. The display panel of claim 2, further comprising a second dam spaced apart from the first dam, between the first inorganic film and the second inorganic film, and outside the organic film.

4. The display panel of claim 3, wherein a plurality of electrode holes are defined in the connection electrode, and
the second dam overlaps at least a portion of the plurality of electrode holes.

5. The display panel of claim 3, wherein the second dam does not overlap the pixel defining film on a plane and overlaps at least a portion of the power electrode on a plane.

6. The display panel of claim 2, wherein the pixel defining film fills the electrode hole.

7. The display panel of claim 2, wherein the connection electrode is on the same layer as the pixel electrode.

8. The display panel of claim 1, wherein the first dam comprises a polymer resin, and
the polymer resin comprises a hydrophobic group having a fluoro group and/or a silyl group.

9. The display panel of claim 8, wherein the polymer resin comprises a first repeating unit represented by Formula 1:

[Formula 1]

wherein in Formula 1,
$R_1$ to $R_3$ are each independently a hydrogen atom, a deuterium atom, a substituted or unsubstituted alkyl group having 1 to 10 carbon atoms, or a substituted or unsubstituted aryl group having 6 to 20 ring-forming carbon atoms,
$m_1$ is an integer of 0 to 5, and
$n_1$ is an integer of 1 to 100.

10. The display panel of claim 9, wherein the first repeating unit is about 0.1 wt % to about 10 wt % with respect to the total mass of the polymer resin.

11. The display panel of claim 9, wherein the polymer resin further comprises at least one of an acrylic repeating unit, an imide repeating unit, an olefin repeating unit, a phenol repeating unit, a siloxane repeating unit, a polyol repeating unit, an ether repeating unit, or a thiol repeating unit, and
the repeating units each independently comprise a substituted or unsubstituted aryl group having 6 to 20 ring-forming carbon atoms.

12. The display panel of claim 11, wherein the acrylic repeating unit is represented by Formula 2-1, the imide repeating unit is represented by Formula 2-2, and the olefin repeat unit is represented by Formula 2-3:

[Formula 2-1]

[Formula 2-2]

[Formula 2-3]

wherein in Formulae 2-1 to 2-3,
$R_4$ to $R_{11}$ are each independently a hydrogen atom, a deuterium atom, a substituted or unsubstituted alkyl group having 1 to 10 carbon atoms, or a substituted or unsubstituted aryl group having 6 to 20 ring-forming carbon atoms,
$m_2$ is an integer of 0 to 5, and
$n_2$ to $n_4$ are each independently an integer of 1 to 100.

13. The display panel of claim 8, wherein the first inorganic film comprises at least one of silicon oxide, silicon nitride, or silicon nitride oxide, and
the organic film comprises an organic polymer having a hydrophilic repeating unit.

14. A display panel comprising:
a base layer on which a display area and a non-display area adjacent to the display area are defined;
a circuit layer on the base layer;
a light emitting element on the circuit layer;
an encapsulation layer on the light emitting element and comprising a first inorganic film, an organic film on the first inorganic film, and a second inorganic film on the organic film; and
a first dam directly between the first inorganic film and the second inorganic film, overlapping the non-display area, and comprising a polymer resin having a first repeating unit represented by Formula 1:

[Formula 1]

wherein in Formula 1,
$R_1$ to $R_3$ are each independently a hydrogen atom, a deuterium atom, a substituted or unsubstituted alkyl group having 1 to 10 carbon atoms, or a substituted or unsubstituted aryl group having 6 to 20 ring-forming carbon atoms,
$m_1$ is an integer of 0 to 5, and
$n_1$ is an integer of 1 to 100.

15. The display panel of claim 14, wherein the polymer resin further comprises at least one of an acrylic repeating unit, an imide repeating unit, an olefin repeating unit, a phenol repeating unit, a siloxane repeating unit, a polyol repeating unit, an ether repeating unit, or a thiol repeating unit, and
the repeating units each independently comprise a substituted or unsubstituted aryl group having 6 to 20 ring-forming carbon atoms.

16. The display panel of claim 14, wherein the circuit layer comprises a pixel circuit layer overlapping the display area and a driving circuit layer overlapping the non-display area,
the driving circuit layer comprising a power electrode and providing a driving signal to the pixel circuit layer,
wherein the light emitting element is on the pixel circuit layer, and comprises a pixel electrode, an emission layer on the pixel electrode, and a common electrode on the emission layer and extending from the display area toward the non-display area,
further comprising a pixel defining film on the pixel electrode and exposing at least a portion of the pixel electrode,
wherein the first dam overlaps the non-display area and the pixel defining film on a plane.

17. The display panel of claim 16, further comprising a connection electrode that electrically connects the power electrode and the common electrode, and in which a plurality of electrode holes are defined,
wherein the first dam overlaps at least a portion of the plurality of electrode holes.

18. The display panel of claim 16, further comprising a second dam on the same layer as the first dam,
wherein the second dam overlaps the pixel defining film on a plane.

19. The display panel of claim 16, further comprising a second dam that does not overlap the pixel defining film on a plane.

* * * * *

UNITED STATES PATENT AND TRADEMARK OFFICE
CERTIFICATE OF CORRECTION

PATENT NO. : 11,522,035 B2  
APPLICATION NO. : 16/929830  
DATED : December 6, 2022  
INVENTOR(S) : Jaeheung Ha et al.

Page 1 of 1

It is certified that error appears in the above-identified patent and that said Letters Patent is hereby corrected as shown below:

In the Claims  
Column 23, Lines 16-24, Claim 1, Formula 1:

Delete " 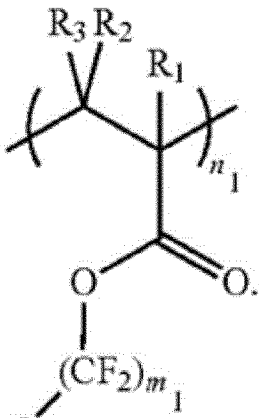 "

Insert -- 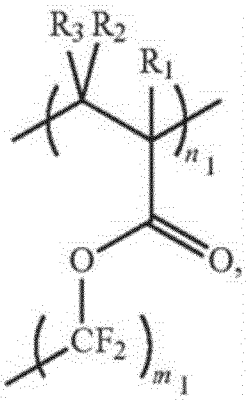 --

Signed and Sealed this  
Eleventh Day of April, 2023

Katherine Kelly Vidal  
*Director of the United States Patent and Trademark Office*